(12) United States Patent
Wang et al.

(10) Patent No.: US 11,814,542 B2
(45) Date of Patent: Nov. 14, 2023

(54) COMPOSITE COATING AND FABRICATION METHOD THEREOF

(71) Applicant: Nano and Advanced Materials Institute Limited, Hong Kong (CN)

(72) Inventors: Song Wang, Hong Kong (CN); Weizhen Wang, Hong Kong (CN); Rong Ma, Hong Kong (CN)

(73) Assignee: Nano and Advanced Materials Institute Limited, Hong Kong (CN)

( * ) Notice: Subject to any disclaimer, the term of this patent is extended or adjusted under 35 U.S.C. 154(b) by 0 days.

(21) Appl. No.: 17/807,913

(22) Filed: Jun. 21, 2022

(65) Prior Publication Data
US 2023/0027265 A1 Jan. 26, 2023

Related U.S. Application Data

(60) Provisional application No. 63/224,442, filed on Jul. 22, 2021.

(51) Int. Cl.
*C23C 14/35* (2006.01)
*C23C 16/448* (2006.01)
(Continued)

(52) U.S. Cl.
CPC ............... *C09D 5/08* (2013.01); *B05D 1/18* (2013.01); *B05D 1/60* (2013.01); *B32B 15/04* (2013.01);
(Continued)

(58) Field of Classification Search
CPC ...... C09D 165/00; C09D 165/04; C09D 5/08; C09D 5/082; B05D 2202/00; B05D 2420/01; B05D 2518/10; B05D 1/18; B05D 1/60; B05D 7/14; C08G 61/025; C08G 2261/3424; C08K 3/36; C08K 5/5419; C08K 5/548; C23C 14/35; C23C 16/4485; C23C 28/00; C23C 28/022; C23C 28/023; C23C 28/026; C23C 30/00; C23C 30/005; C23C 14/024; C23C 14/025; C23C 14/14;
(Continued)

(56) References Cited

U.S. PATENT DOCUMENTS 10,668,189 B2   6/2020   Chu et al.
2019/0323970 A1  10/2019   Chu et al.
(Continued)

OTHER PUBLICATIONS

Chu, Jinn P., et al. "Coating cutting blades with thin-film amorphous metal to enhance sharpness." Scientific Reports 9.1 (2019): 1-11.
(Continued)

*Primary Examiner* — Michael E. La Villa
(74) *Attorney, Agent, or Firm* — S&F/WEHRW (57) ABSTRACT

The present disclosure provides a composite coating and a method for fabricating the composite coating. The composite coating comprises a polymer layer, a metal interlayer and an amorphous metal coating. The polymer layer is formed on a substrate and acts as a diffusion barrier layer, which is thick and dense enough to prevent the corrosive substances from penetrating into the substrate. The metal interlayer is formed between the polymer layer and the amorphous metal coating for improving the adhesion of the amorphous metal coating to the substrate.

15 Claims, 7 Drawing Sheets

(51) Int. Cl.
| | |
|---|---|
| C23C 28/02 | (2006.01) |
| B05D 1/00 | (2006.01) |
| C08G 61/02 | (2006.01) |
| C08K 3/36 | (2006.01) |
| C08K 5/5419 | (2006.01) |
| C08K 5/548 | (2006.01) |
| C09D 5/08 | (2006.01) |
| C09D 165/04 | (2006.01) |
| B05D 1/18 | (2006.01) |
| C09D 165/00 | (2006.01) |
| C23C 28/00 | (2006.01) |
| B32B 15/04 | (2006.01) |
| B32B 15/08 | (2006.01) |
| C23C 30/00 | (2006.01) |
| B32B 15/20 | (2006.01) |
| C23C 14/02 | (2006.01) |
| C23C 14/14 | (2006.01) |
| B05D 7/14 | (2006.01) |

(52) U.S. Cl.
CPC ............ *B32B 15/043* (2013.01); *B32B 15/08* (2013.01); *B32B 15/20* (2013.01); *C08G 61/025* (2013.01); *C08K 3/36* (2013.01); *C08K 5/548* (2013.01); *C08K 5/5419* (2013.01); *C09D 5/082* (2013.01); *C09D 165/00* (2013.01); *C09D 165/04* (2013.01); *C23C 14/024* (2013.01); *C23C 14/025* (2013.01); *C23C 14/14* (2013.01); *C23C 14/35* (2013.01); *C23C 16/4485* (2013.01); *C23C 28/00* (2013.01); *C23C 28/022* (2013.01); *C23C 28/023* (2013.01); *C23C 28/026* (2013.01); *C23C 30/00* (2013.01); *C23C 30/005* (2013.01); *B05D 7/14* (2013.01); *B05D 2202/00* (2013.01); *B05D 2420/01* (2013.01); *C08G 2261/3424* (2013.01); *Y10T 428/1275* (2015.01); *Y10T 428/1291* (2015.01); *Y10T 428/12556* (2015.01); *Y10T 428/12569* (2015.01); *Y10T 428/12639* (2015.01); *Y10T 428/12646* (2015.01); *Y10T 428/12736* (2015.01); *Y10T 428/12757* (2015.01); *Y10T 428/12764* (2015.01); *Y10T 428/12771* (2015.01); *Y10T 428/12806* (2015.01); *Y10T 428/12812* (2015.01); *Y10T 428/12819* (2015.01); *Y10T 428/12826* (2015.01); *Y10T 428/12847* (2015.01); *Y10T 428/12854* (2015.01); *Y10T 428/12861* (2015.01); *Y10T 428/12868* (2015.01); *Y10T 428/12875* (2015.01); *Y10T 428/12903* (2015.01); *Y10T 428/12931* (2015.01); *Y10T 428/12937* (2015.01); *Y10T 428/12944* (2015.01); *Y10T 428/12951* (2015.01); *Y10T 428/2495* (2015.01); *Y10T 428/24942* (2015.01); *Y10T 428/24959* (2015.01); *Y10T 428/24967* (2015.01); *Y10T 428/26* (2015.01); *Y10T 428/265* (2015.01)

(58) Field of Classification Search
CPC ....... B32B 15/04; B32B 15/08; B32B 15/043; B32B 15/20; Y10T 428/12556; Y10T 428/12569; Y10T 428/12639; Y10T 428/12646; Y10T 428/12771; Y10T 428/12736; Y10T 428/12743; Y10T 428/12847; Y10T 428/12854; Y10T 428/1275; Y10T 428/12757; Y10T 428/12764; Y10T 428/12806; Y10T 428/12812; Y10T 428/12819; Y10T 428/12826; Y10T 428/12861; Y10T 428/12868; Y10T 428/12875; Y10T 428/12903; Y10T 428/1291; Y10T 428/12931; Y10T 428/12937; Y10T 428/12944; Y10T 428/12951; Y10T 428/24942; Y10T 428/2495; Y10T 428/24959; Y10T 428/24967; Y10T 428/265; Y10T 428/26
See application file for complete search history.

(56) References Cited

U.S. PATENT DOCUMENTS

| | | | |
|---|---|---|---|
| 2020/0003717 A1 | 1/2020 | Chu et al. | |
| 2020/0040448 A1* | 2/2020 | Wu | ................ H01L 21/28568 |
| 2020/0283908 A1* | 9/2020 | Jana | ........................ C09D 4/00 |

OTHER PUBLICATIONS

Tsai, P. H., et al. "Coating thickness effect of amorphous metal thin film on the fatigue-properties improvement of 7075 aluminum alloy." Thin Solid Films 677 (2019): 68-72.

\* cited by examiner

COMPOSITE COATING AND FABRICATION METHOD THEREOF

CROSS-REFERENCE TO RELATED APPLICATION

This application claims priority from the U.S. provisional patent application No. 63/224,442 filed Jul. 22, 2021, which the disclosure is incorporated herein by reference in its entirety.

TECHNICAL FIELD

The present disclosure relates to a composite coating, and more particularly, relates to an amorphous metal/polymer composite coating and a fabrication method thereof.

BACKGROUND

Electroplating, being adopted for surface modification in industry for over 100 years, is a conventional technique to form a thick, solid and anti-corrosive coating on a surface. The electroplating process is simple, fast, convenient and relatively low-cost. Today, it is, therefore, the mainstream technique to improve the surface properties of metals. However, a typical Cr or Ni electroplating process generates large amounts of industrial pollutants in water, resulting in severe water contamination. As the demand for environmental-friendly coating increases, a green technique to substitute electroplating is highly desired.

Amorphous metal coating, deposited by a non-polluting magnetron sputtering process, demonstrates many excellent mechanical properties, like high hardness, high wear-resistance and fatigue-resistance, and has the potential to be the next-generation of green coating. Nevertheless, the use of sputtered amorphous metal coating as a protection layer is limited, since it suffers from the technical hurdle that the as-deposited coating tends to contain cracks and pores, and therefore cannot protect the underlying substrate from the corrosive environment.

A need therefore exists for a novel coating that eliminates or at least diminishes the disadvantages and problems described above.

SUMMARY

In order to solve the aforesaid problems, the present disclosure provides a composite coating comprising a polymer layer, a metal interlayer and an amorphous metal coating. The polymer layer is formed on a substrate and acts as a diffusion barrier layer, which is thick and dense enough to prevent the corrosive substances from penetrating into the substrate. The metal interlayer is formed between the polymer layer and the amorphous metal coating for improving the adhesion of the amorphous metal coating to the substrate.

Provided herein is a composite coating comprising: a polymer layer for covering a surface of a substrate, the polymer layer being a silane layer or a parylene layer, the silane layer comprising a silicon-based polymer, the parylene layer consisting of parylene C; a metal interlayer having a crystalline structure and covering the polymer layer; and an amorphous metal coating covering the metal interlayer such that the metal interlayer is sandwiched between the polymer layer and the amorphous metal coating.

In certain embodiments, the silicon-based polymer is a reaction product of triethoxymethylsilane, (3-mercaptopropyl)trimethoxysilane under a sol-gel process.

In certain embodiments, the silane layer further comprises silica.

In certain embodiments, the polymer layer has a thickness from 5 μm to 10 μm.

In certain embodiments, the metal interlayer consists of a metal being the same as a metal present in the amorphous metal coating.

In certain embodiments, the metal interlayer consists of titanium, aluminum or chromium.

In certain embodiments, the metal interlayer has a thickness from 20 nm to 50 nm.

In certain embodiments, the amorphous metal coating comprises zirconium, copper, nickel, aluminum, titanium, iron, palladium, or a combination thereof.

In certain embodiments, the amorphous metal coating consists of a zirconium-based amorphous alloy, a copper-based amorphous alloy, a nickel-based amorphous alloy, an aluminum-based amorphous alloy, a titanium-based amorphous alloy, an iron-based amorphous alloy, or a palladium-based amorphous alloy.

In certain embodiments, the amorphous metal coating consists of an amorphous metal having a chemical formula of $Zr_wCu_xAl_yNi_z$ (at %), where w is from 47 to 58, x is from 25 to 31, y is from 10 to 15, z is from 6 to 10.

In certain embodiments, the amorphous metal coating has a thickness from 200 nm to 1000 nm.

Provided herein is a method for fabricating the composite coating described above, the polymer layer being the silane layer, the method comprising: forming the silane layer on the surface of the substrate by a sol-gel process; forming the metal interlayer on the silane layer by magnetron sputtering; and forming the amorphous metal coating on the metal interlayer by magnetron sputtering thereby forming the composite coating.

In certain embodiments, the step of forming the silane layer comprising: coating a silane solution on the surface of the substrate; and curing the silane solution thereby forming the silane layer.

In certain embodiments, the silane solution is prepared by mixing at least triethoxymethylsilane, (3-mercaptopropyl) trimethoxysilane, colloidal silica and organic solvents to form a mixed solution; and heating the mixed solution at 70° C. to form the silane solution; after dip coating or other sol-gel processes on substrates, the silane solution is cured at a temperature in a range of 80 to 120° C. to form the silane layer.

In certain embodiments, prior to the step of forming the metal interlayer, an exposed surface of the silane layer is treated by plasma.

Provided herein is a method for fabricating the composite coating described above, the polymer layer being the parylene layer, the method comprising: forming the parylene layer on the surface of the substrate by chemical vapor deposition; forming the metal interlayer on the parylene layer by magnetron sputtering; and forming the amorphous metal coating on the metal interlayer by magnetron sputtering thereby forming the composite coating.

In certain embodiments, the step of forming the parylene layer comprises: decomposing a parylene C precursor into free radicals in a vapor phase; and depositing the free radicals on the surface of the substrate thereby forming the parylene layer.

In certain embodiments, the parylene C precursor is decomposed at a temperature from 600° C. to 800° C.

In certain embodiments, prior to the step of forming the metal interlayer, an exposed surface of the parylene layer is treated by plasma.

Provided herein is an article comprising a body and the composite coating described above, the composite coating being formed on a surface of the body.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Other aspects of the present invention are disclosed as illustrated by the embodiments hereinafter.

BRIEF DESCRIPTION OF DRAWINGS

The appended drawings, where like reference numerals refer to identical or functionally similar elements, contain figures of certain embodiments to further illustrate and clarify the above and other aspects, advantages and features of the present invention. It will be appreciated that these drawings depict embodiments of the invention and are not intended to limit its scope. The invention will be described and explained with additional specificity and detail through the use of the accompanying drawings in which.

Skilled artisans will appreciate that elements in the figures are illustrated for simplicity and clarity and have not necessarily been depicted to scale.

DETAILED DESCRIPTION OF THE INVENTION

The present disclosure provides a composite coating comprising a polymer layer as a diffusion barrier layer, an amorphous metal coating as a surface enhancement layer, and a metal interlayer for improving the adhesion of the amorphous metal coating to the substrate surface, thereby providing a high-quality, multi-functional coating. The composite coating combines the diffusion barrier characteristic of polymer together with the outstanding mechanical properties of amorphous metal, which enables the substrate surface to have metallic colors, high hardness, high wear-resistance, and/or high resistance to corrosion.

Figure 1:
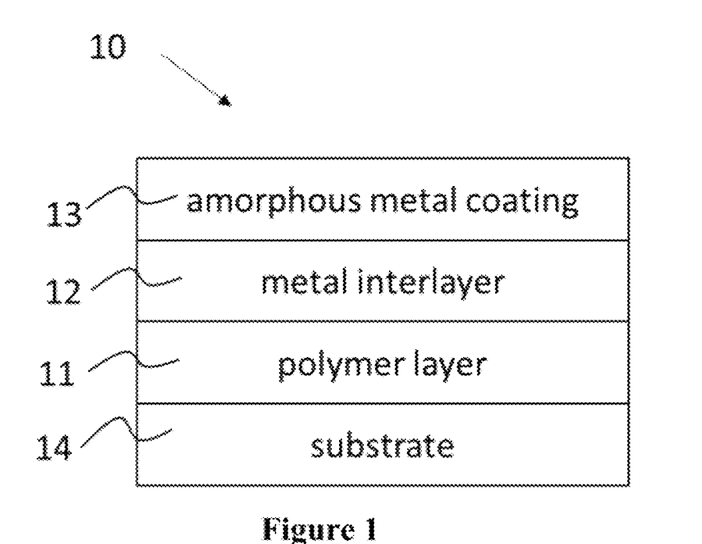
FIG. 1 is a schematic diagram depicting a composite coating according to certain embodiments.

FIG. 1 is a schematic diagram depicting a composite coating 10 for surface protection according to certain embodiments. The composite coating 10 has a layer structure and comprises a polymer layer 11, a metal interlayer 12 and an amorphous metal coating 13. The metal interlayer 12 is sandwiched between the polymer layer 11 and the amorphous metal coating 13. The polymer layer 11 covers a surface of a substrate 14. The metal interlayer 12 consists of a pure metal having a crystalline structure and covers the polymer layer 11 for improving the adhesion of the amorphous metal coating 13 to the substrate 14. The amorphous metal coating 13 consists of an amorphous alloy having an amorphous structure and covers the metal interlayer 12.

In certain embodiments, the polymer layer is a silane layer comprising a silicon-based polymer. The silane layer has excellent scratch and corrosion resistance for protecting the substrate. In addition, the long hydrocarbon chains of the silane layer exhibit low surface energies, which enhance adhesion of the amorphous metal coating to the substrate.

In certain embodiments, the silicon-based polymer is a reaction product of triethoxymethylsilane, (3-mercaptopropyl)trimethoxysilane by a sol-gel process.

In certain embodiments, the silane layer further comprises silica, which has excellent adsorbability and cohesiveness for improving the adhesion of the silane layer on substrate after heating in oven, and enhancing the adhesion of interlayer.

In certain embodiments, the polymer layer is a parylene layer consisting of parylene C. The parylene layer can protect the substrate against caustic substances, acids, water, etc. In addition, since the parylene layer can be formed by chemical vapor deposition, the parylene layer can be used to modify the surface of articles with precise and complicated shape.

In certain embodiments, the polymer layer has a thickness from 5 μm to 10 μm.

In certain embodiments, the metal interlayer consists of a metal being the same as a metal present in the amorphous metal coating for further improving the adhesion of the amorphous metal coating to the metal interlayer.

In certain embodiments, the metal interlayer consists of titanium, aluminum or chromium.

In certain embodiments, the metal interlayer has a thickness from 20 nm to 50 nm.

In certain embodiments, the amorphous metal coating comprises zirconium, copper, nickel, aluminum, titanium, iron, palladium, or a combination thereof.

In certain embodiments, the amorphous metal coating consists of a zirconium-based amorphous alloy, a copper-based amorphous alloy, a nickel-based amorphous alloy, an aluminum-based amorphous alloy, a titanium-based amorphous alloy, an iron-based amorphous alloy, or a palladium-based amorphous alloy.

In certain embodiments, the amorphous metal coating consists of an amorphous metal having a chemical formula of ZrCuNiAl. Preferably, the amorphous metal has a chemical formula of $Zr_wCu_xAl_yNi_z$ (at %), where w is from 47 to 58, x is from 25 to 31, y is from 10 to 15, z is from 6 to 10. Preferably, the chemical formula is $Zr_{53}Cu_{29}Al_{12}Ni_6$ (at %).

In certain embodiments, the amorphous metal coating has a thickness from 200 nm to 1000 nm.

In certain embodiments, the substrate is a metal substrate, a ceramic substrate, a polymer substrate, or a glass substrate. The metal substrate is made of stainless steel, brass, magnesium alloy, or zinc alloy.

Figure 2:
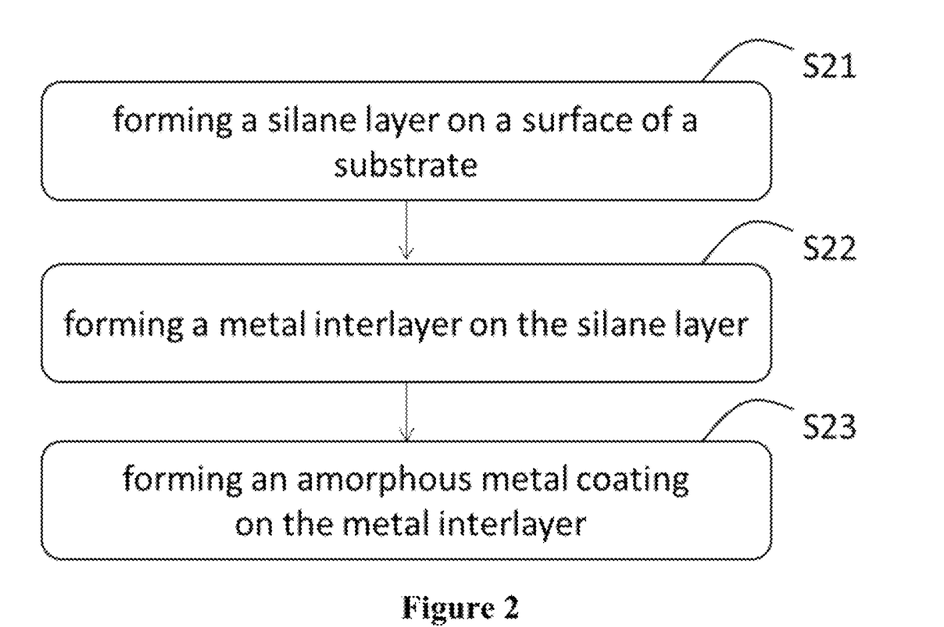
FIG. 2 is a flow chart depicting a method for fabricating a composite coating having a silane layer according to certain embodiments.

FIG. 2 is a flow chart depicting a method for fabricating a composite coating according to certain embodiments. In step S21, a silane layer is formed on a surface of a substrate by a sol-gel process. In step S22, a metal interlayer is formed on the silane layer by magnetron sputtering. In step S23, an amorphous metal coating is formed on the metal interlayer by magnetron sputtering.

In certain embodiments, the step of forming the silane layer comprises: coating a silane solution on the surface of the substrate; and curing the silane solution thereby forming the silane layer. The silane solution can be coated on the surface by spin coating, dip coating, brush coating, or spray coating.

In certain embodiments, the silane solution is prepared by mixing at least triethoxymethylsilane, (3-mercaptopropyl)trimethoxysilane, colloidal silica and organic solvents to form a mixed solution; and heating the mixed solution at 70° C. to form the silane solution.

In certain embodiments, after sol-gel process on the substrate, the silane solution is cured at a temperature in a range of 80 to 120° C. to form the silane layer.

In certain embodiments, prior to the step of forming the metal interlayer, an exposed surface of the silane layer is treated by plasma.

Figure 3:
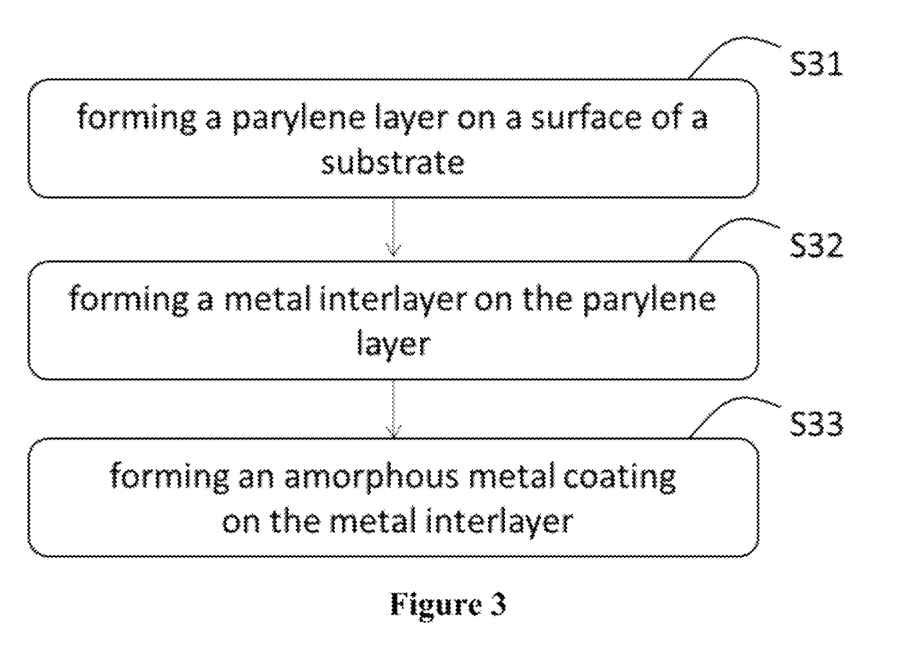
FIG. 3 is a flow chart depicting a method for fabricating a composite coating having a parylene layer according to certain embodiments.

FIG. 3 is a flow chart depicting a method for fabricating a composite coating according to certain embodiments. In step S31, a parylene layer is formed on a surface of a substrate by chemical vapor deposition. In step S32, a metal interlayer is formed on the parylene layer by magnetron sputtering. In step S33, an amorphous metal coating is formed on the metal interlayer by magnetron sputtering.

In certain embodiments, the step of forming the parylene layer comprises: decomposing a parylene C precursor into free radicals in a vapor phase; and depositing the free radicals on the surface of the substrate thereby forming the parylene layer.

In certain embodiments, the parylene C precursor is decomposed at a temperature from 600° C. to 800° C. In certain embodiments, the parylene C precursor is a parylene C powder of dichloro-[2,2]-paracyclophane ($C_{16}H_{14}C_{12}$).

In certain embodiments, prior to the step of forming the metal interlayer, an exposed surface of the parylene layer is treated by plasma.

Example 1

A silane layer was formed on a metal substrate by a sol-gel process. In the sol-gel process, an acid catalyzed solution of methyltriethoxysilane was coated on metal substrate by a dip coating method and then baked at 100° C. for more than 1 hour.

A silane solution was prepared by the following steps:
1) Add 18.78 g of triethoxymethylsilane (MTES) into a glass bottle.
2) Add 1.66 g of (3-mercaptopropyl)trimethoxysilane into above glass bottle containing MTES.
3) Add 5.67 g of ethanol into the solution.
4) Add 0.50 g of acetone into the solution.
5) Add 5.00 g of DI water into the solution.
6) Add 2.03 g of 3% LUDOX HS-30 colloidal silica solution (prepared by diluting 30% LUDOX HS-30 colloidal silica solution).
7) Add 0.50 g of acetic acid into the solution.
8) Stir the solution with a magnetic stirrer at room temperature for 15 minutes.
9) Ultrasonicate the solution in room temperature water bath for 45 minutes.
10) Keep heating the solution at 70° C. in an oven for 18 hours.
11) Cool down the solution to room temperature and the prepared solution is ready for dip coating.

Before the sol-gel process, the silane solution was diluted by ethanol with a volume ratio (silane solution:ethanol) of 1:1, 1:1.5, 1:2, 1:2.5, and 1:3, and the ratio of 1:2 is the optimized result. Accordingly, a high concentration of silane increases the viscosity of solution and thus can trap more bubbles in the coatings, while a low concentration of silane decreases the coating thickness, which may not be thick enough to protect the substrate.

Example 2

The parylene coating was formed by chemical vapor deposition (CVD) process. Parylene C precursors (dimers) were evaporated at 175° C. and decomposed at 690° C. to form free radicals in the vapor phase, and then they were transferred to the substrate to form a parylene coating with a thickness of ~10 μm. The parylene thickness can be tuned by changing the amount of precursors.

Example 3

A titanium interlayer and an amorphous metal (ZrCuNiAl) coating were formed on a silane layer by a magnetron sputtering process.

Different interlayer materials, e.g., Ti, Al, Cr, were used and tested for their adhesion abilities on various substrates. It has been found that Ti interlayer with a thickness ranging from 20 to 50 nm can achieve the best adhesion and provide the most consistent results.

The Ti interlayer and the amorphous metal coating were formed by a magnetron sputtering process, in which metal targets (purity>99.99%) and substrates were located in a high-vacuum chamber with a pressure of less than $10^{-4}$ Pa and a working pressure of 0.3 Pa (argon flow: 80 sccm). The working pressure was optimized at 0.3 Pa since a high pressure (>0.4 Pa) greatly decreases the deposition rate while a low pressure (<0.2 Pa) may generate high strain in the coatings.

The Ti target was sputtered by a radio frequency power supply with a power density of 2.47 W/cm² for 3-5 min, and the ZrCuNiAl amorphous metal target was sputtered by a direct current power supply with a power density of 2.22 to 2.71 W/cm² for 15-30 min. The powers were optimized in the above ranges in order to achieve high adhesion ability and boost deposition rate simultaneously. The distance between the targets and the substrates was 10 cm. The sample holder was rotated with a speed of 30 rpm.

Figure 4A:
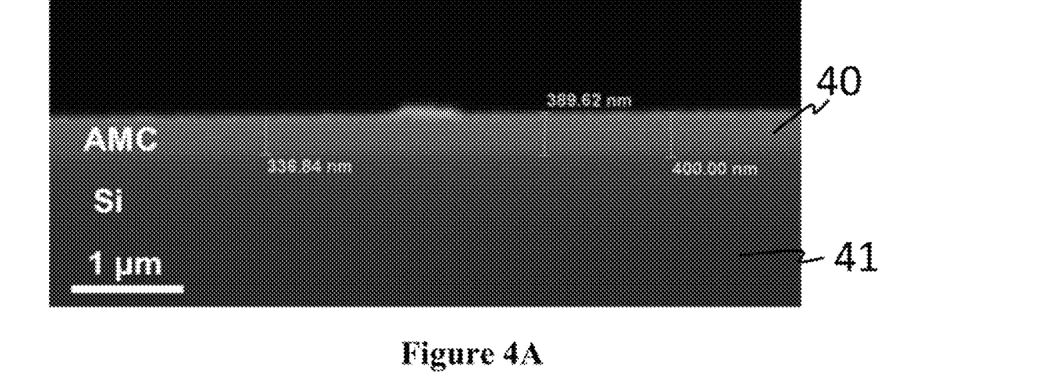
FIG. 4A is a scanning electron microscope (SEM) image showing a cross section of an AMC on a silicon substrate in low magnification.
Figure 4B:
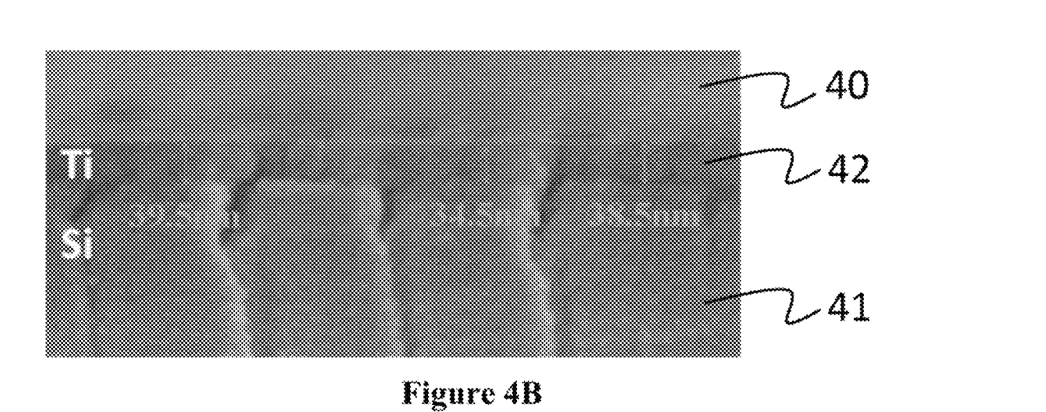
FIG. 4B is an SEM image showing a cross section of the Ti interlayer between the AMC and the silicon substrate in high magnification.

FIGS. 4A and 4B show a cross-section of an AMC 40 on a silicon substrate 41. The AMC 40 consists of ZrCuNiAl and has a thickness from 336.84 nm to 400 nm. A Ti interlayer 42 is not clearly shown in FIG. 4A due to the low magnification of the image but is shown in FIG. 4B. The Ti interlayer 42 has a thickness from 34.5 nm to 39.5 nm.

Figure 5:
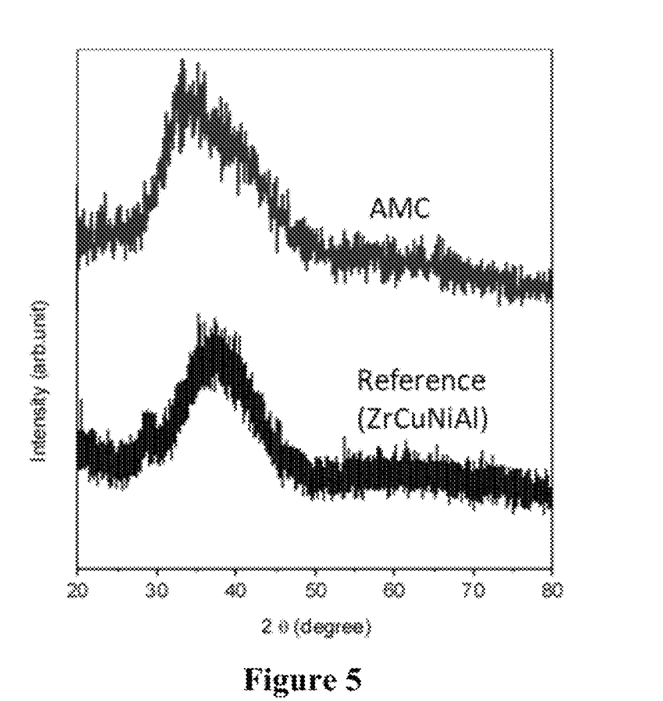
FIG. 5 shows X-ray diffraction (XRD) spectrum of the AMC.

FIG. 5 shows the XRD spectrum of the AMC. The XRD spectrum of the AMC is similar to the reference sample of ZrCuNiAl, which demonstrates the AMC has been well coated on the Ti interlayer.

Example 4

Figure 6:
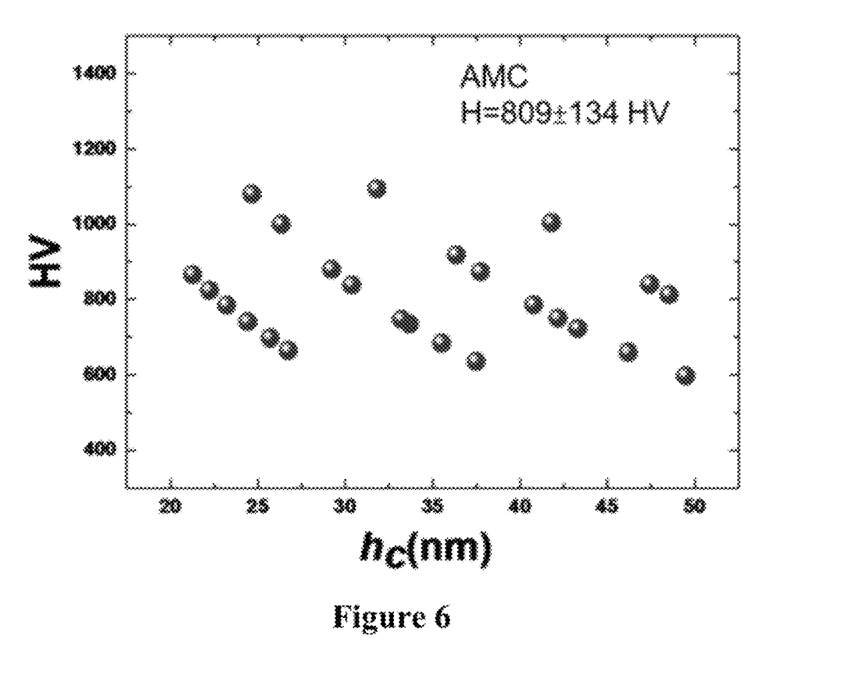
FIG. 6 shows the results of a hardness test of the AMC/silane coating.

A nanoindentation hardness test was performed for the AMC(ZrCuNiAl)/silane on stainless steel. The results of the hardness test are shown in FIG. 6, and one set of statistical data is obtained from different places of the sample surface in order to guarantee the uniformity and reliable results. Based on this testing operation, the hardness is varies with the depth of the nano indenter. The AMC has a hardness of 809±134 HV.

Example 5

Figure 7:
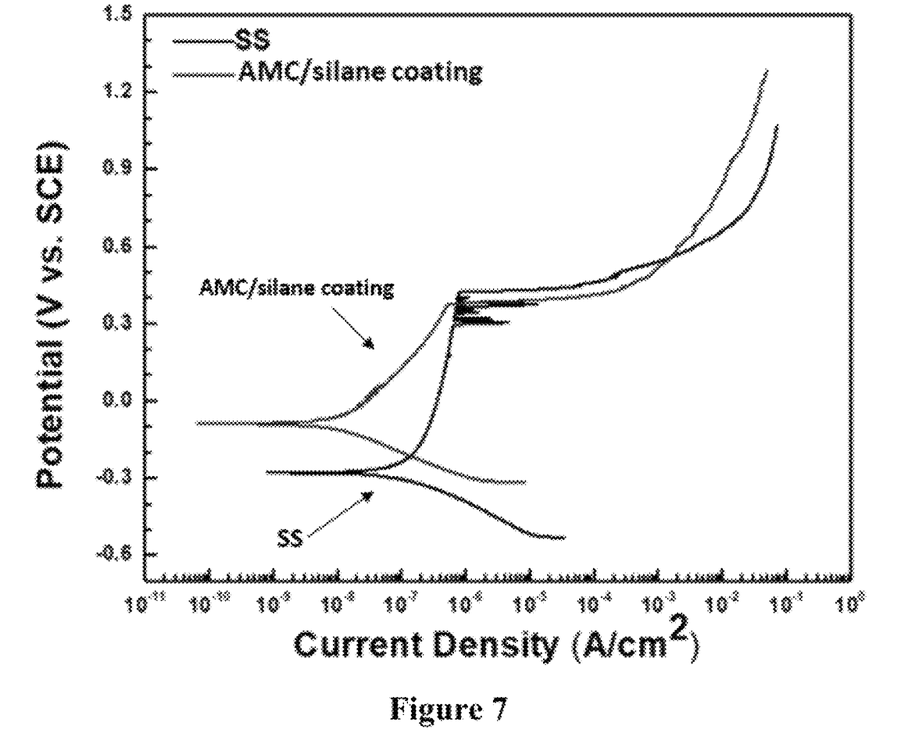
FIG. 7 shows the comparison of corrosion current density of the AMC/silane coating on a stainless steel substrate and bare stainless steel (SS) in a corrosion resistance test.

A corrosion resistance test was performed for the AMC/silane coating. A dynamic electrochemical polarization technique was used to provide information regarding the corrosion resistance of the AMC/silane coating on a stainless steel substrate and a bare 316 stainless steel. The results of the corrosion resistance test are shown in FIG. 7. Based on the results, the corrosion current density of the bare stainless steel is estimated to be $8.38 \times 10^{-8}$ A/cm$^{-2}$, while the corrosion current density of the AMC/silane coating on the stainless steel substrate is estimated to be $1.06 \times 10^{-8}$ A/cm$^{-2}$. Accordingly, the corrosion current density of the AMC/silane coating on the stainless steel substrate is lower than that of the bare stainless steel, which demonstrates that the AMC/silane coating provides good corrosion resistance.

Example 6

Figure 8:
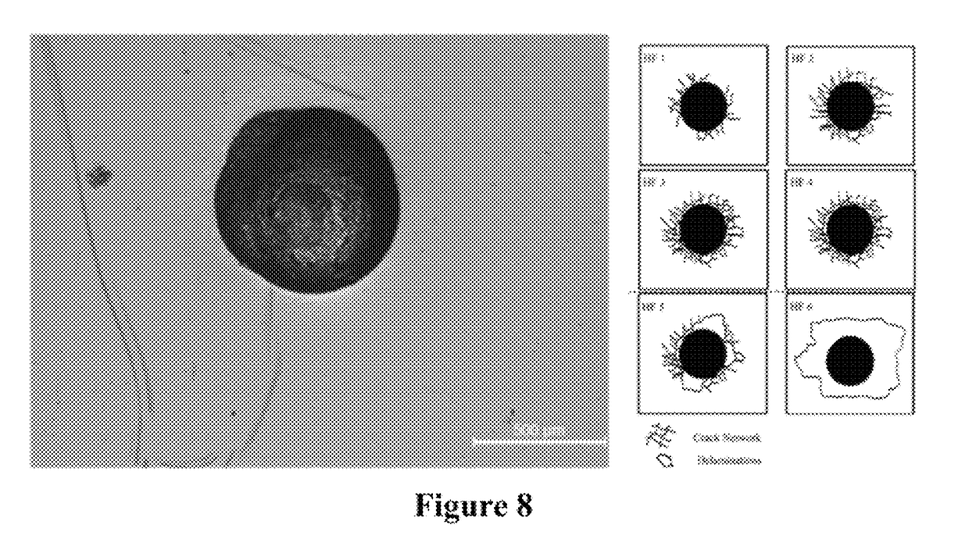
FIG. 8 shows an optical image of the AMC/silane coating after the HRC-DB test.

A coating adhesion (HRC-DB) test was performed for the AMC/silane coating. In the measurement, a Rockwell "C"-type diamond cone indenter with an applied load of 150 kg was used to press the sample and create an indent. Once the load was removed, the indent was examined by using an optical microscope, and classified the coating adhesion as HF 1 to HF 6, according to the amount of cracking or thin film delamination around the indent. The optical image of the AMC/silane coating after the test is shown in FIG. 8, and the coating adhesion of the AMC/silane coating can be classified as HF 1, which demonstrates that the coating has good adhesion to the substrate.

Figure 9:
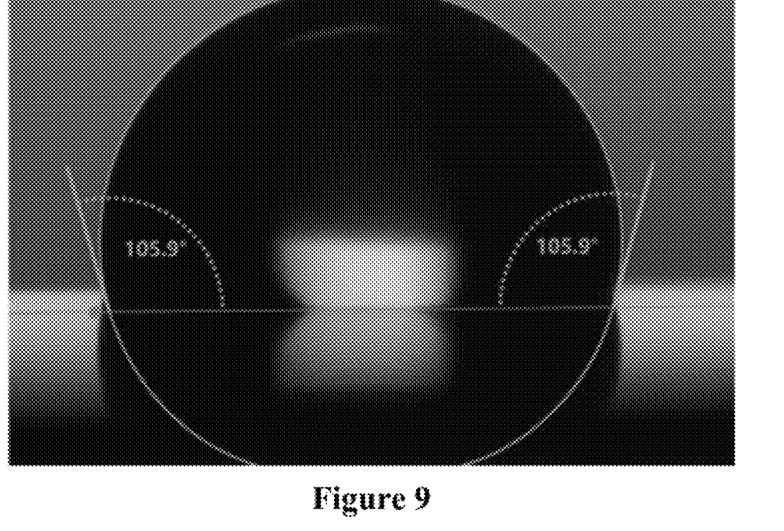
FIG. 9 shows the water contact angle of the AMC/silane coating.

FIG. 9 shows the water contact angle of the AMC/saline composite coating, and the water contact angel is 105.9°.

Example 7

Figure 10A:
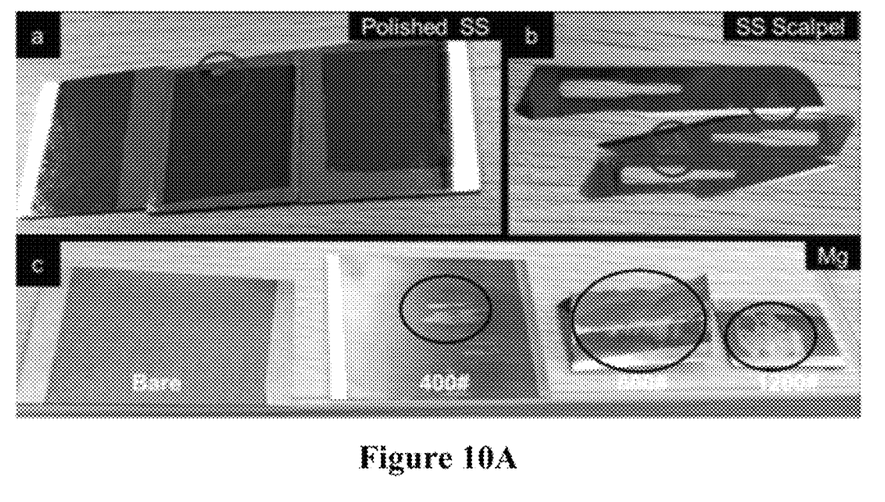
FIG. 10A shows an amorphous metal coating with an Al interlayer on polished stainless steel (SS), SS scalpel and magnesium alloy after a tape test.
Figure 10B:
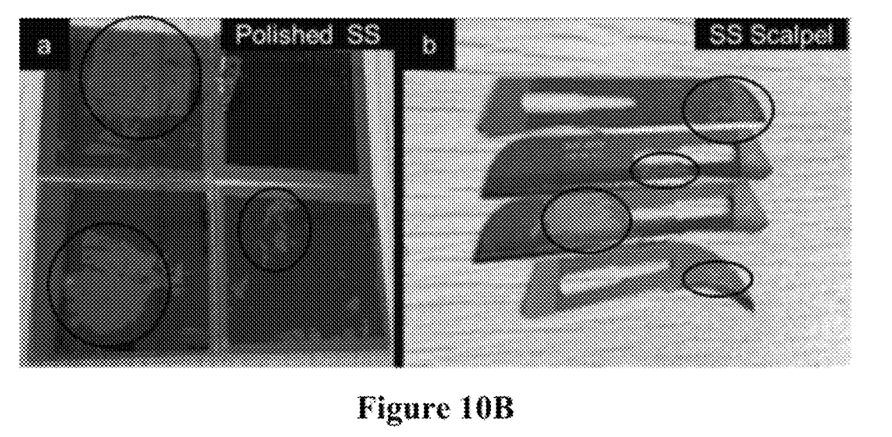
FIG. 10B shows an amorphous metal coating with a Cr interlayer on polished SS and SS scalpel after the tape test.
Figure 10C:
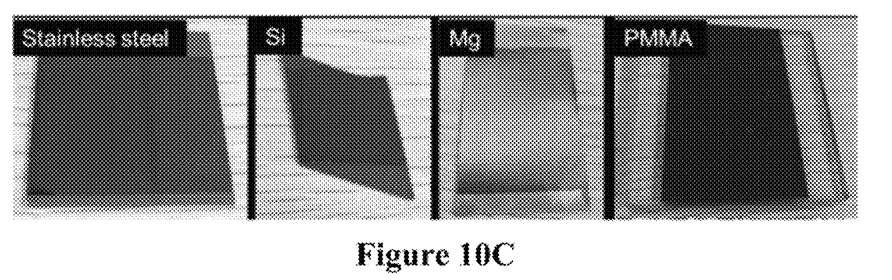
FIG. 10C shows an amorphous metal coating with a Ti interlayer on stainless steel, silicon, magnesium alloy and poly(methyl methacrylate) (PMMA) after the tape test.

A tape test was performed for different amorphous metal coatings with an Al interlayer, a Cr interlayer and a Ti interlayer respectively on different substrates. As shown in FIG. 10A, some areas of the amorphous metal coating with the Al interlayer are peeled off after the tape test as indicated by circles. As shown in FIG. 10B, some areas of the amorphous metal coating with the Cr interlayer are peeled off after the tape test as indicated by circles. In contrast, as shown in FIG. 10C, there is no peeling off of the amorphous metal coating with the Ti interlayer after the tape test that demonstrates the Ti interlayer can provide better adhesion of the amorphous metal coating than the Al interlayer and the Cr interlayer.

Accordingly, the present composite coating is applicable, but not limited to watch jewellery, gear, kitchenware, sanitary ware, medical tools, etc.

Thus, it can be seen that an improved composite coating has been disclosed which eliminates or at least diminishes the disadvantages and problems associated with prior art products and processes. The polymer layer of the present composite coating acts as a diffusion barrier layer to prevent the corrosive substances from penetrating into the substrate. The metal interlayer of the composite coating can improve the adhesion of the amorphous metal coating to the substrate.

Although the invention has been described in terms of certain embodiments, other embodiments apparent to those of ordinary skill in the art are also within the scope of this invention. Accordingly, the scope of the invention is intended to be defined only by the claims which follow.

What is claimed is:

1. A composite coating comprising:
   a polymer layer for covering a surface of a substrate, the polymer layer comprising a silicon-based polymer being a reaction product of triethoxymethylsilane and (3-mercaptopropyl)trimethoxysilane under a sol-gel process;
   a metal interlayer having a crystalline structure and covering the polymer layer; and
   an amorphous metal coating covering the metal interlayer such that the metal interlayer is sandwiched between the polymer layer and the amorphous metal coating.

2. The composite coating of claim 1, wherein the polymer layer further comprises silica.

3. The composite coating of claim 1, wherein the polymer layer has a thickness from 5 µm to 10 µm.

4. The composite coating of claim 1, wherein the metal interlayer consists of a metal being the same as a metal present in the amorphous metal coating.

5. The composite coating of claim 1, wherein the metal interlayer consists of titanium, aluminum or chromium.

6. The composite coating of claim 1, wherein the metal interlayer has a thickness from 20 nm to 50 nm.

7. The composite coating of claim 1, wherein the amorphous metal coating consists of zirconium, copper, nickel, and aluminum.

8. The composite coating of claim 7, wherein the amorphous metal coating has a chemical formula of $Zr_wC_xAl_yNi_z$ (at %), where w is from 47 to 58, x is from 25 to 31, y is from 10 to 15, z is from 6 to 10.

9. The composite coating of claim 1, wherein the amorphous metal coating consists of a zirconium-based amorphous alloy, a copper-based amorphous alloy, a nickel-based amorphous alloy, an aluminum-based amorphous alloy, a titanium-based amorphous alloy, an iron-based amorphous alloy, or a palladium-based amorphous alloy.

10. The composite coating of claim 1, wherein the amorphous metal coating has a thickness from 200 nm to 1000 nm.

11. An article comprising a body and the composite coating of claim 1, the composite coating being formed on a surface of the body.

12. A method for fabricating the composite coating of claim 1, the method comprising:
    forming the polymer layer on the surface of the substrate by a so gel process;
    forming the metal interlayer un the silane layer by magnetron sputtering; and forming the amorphous metal coating on the metal interlayer by magnetron sputtering thereby forming the composite coating.

13. The method of claim 12, wherein the step of forming the polymer layer comprising:
coating a silane solution on the surface of the substrate; and
curing the silane solution thereby forming the polymer layer.

14. The method of claim 13, wherein the silane solution is prepared by mixing at least triethoxymethylsilane, (3-mercaptopropyl)trimethoxysilane, colloidal silica and one or more organic solvents to form a mixed solution, and heating the mixed solution at 70° C. to form the silane solution; and the silage solution is cured at a temperature in a range of 80 to 120° C. to form the polymer layer.

15. The method of claim 12, wherein prior to the step of forming the metal interlayer, an exposed surface of the polymer layer is treated by plasma.

* * * * *